United States Patent
Bourdais et al.

(10) Patent No.: US 9,731,262 B2
(45) Date of Patent: Aug. 15, 2017

(54) LARGE-GRAIN CRYSTALLIZED METAL CHALCOGENIDE FILM, COLLOIDAL SOLUTION OF AMORPHOUS PARTICLES, AND PREPARATION METHODS

(71) Applicant: IMRA EUROPE SAS, Valbonne (FR)

(72) Inventors: Stephane Bourdais, Antibes (FR); Christophe Chone, La Colle sur Loup (FR); Yan Cuccaro, Antibes (FR)

(73) Assignee: IMRA EUROPE SAS, Valbonne (FR)

( * ) Notice: Subject to any disclaimer, the term of this patent is extended or adjusted under 35 U.S.C. 154(b) by 0 days.

(21) Appl. No.: 14/413,316

(22) PCT Filed: Jul. 4, 2013

(86) PCT No.: PCT/FR2013/051597
§ 371 (c)(1),
(2) Date: Jan. 7, 2015

(87) PCT Pub. No.: WO2014/016489
PCT Pub. Date: Jan. 30, 2014

(65) Prior Publication Data
US 2015/0194548 A1    Jul. 9, 2015

(30) Foreign Application Priority Data
Jul. 26, 2012 (FR) ..................... 12 57242

(51) Int. Cl.
*B01F 3/00* (2006.01)
*B01F 17/00* (2006.01)
(Continued)

(52) U.S. Cl.
CPC ....... *B01J 13/0008* (2013.01); *B01J 13/0013* (2013.01); *B01J 13/0017* (2013.01);
(Continued)

(58) Field of Classification Search
CPC ...... B82Y 30/00; B82Y 40/00; B01J 13/0008; B01J 13/0013; B01J 13/0017
(Continued)

(56) References Cited

U.S. PATENT DOCUMENTS 6,126,740 A * 10/2000 Schulz .................. C30B 29/46
                                                                    117/4
2011/0226991 A1 * 9/2011 Treadway .......... A61K 49/0067
                                                                    252/301.6 S
(Continued)

FOREIGN PATENT DOCUMENTS

CN  WO 2011065994 A2 * 6/2011  ....... H01L 21/02568
WO        9937832 A1    7/1999
(Continued)

OTHER PUBLICATIONS

International Search Report dated Jul. 23, 2014, corresponding to International Patent Application PCT/FR2013/051597.

*Primary Examiner* — Lindsey Bernier
(74) *Attorney, Agent, or Firm* — Ladas & Parry LLP

(57) ABSTRACT

The present invention relates to a method for preparing an aqueous or hydro-alcoholic colloidal solution of metal chalcogenide amorphous nanoparticles notably of the $Cu_2ZnSnS_4$ (CZTS) type and to the obtained colloidal solution.

The present invention also relates to a method for manufacturing a film of large-grain crystallized semi-conducting metal chalcogenide film notably of CZTS obtained from an aqueous or hydro-alcoholic colloidal solution according to the invention, said film being useful as an absorption layer deposited on a substrate applied in a solid photovoltaic device.

8 Claims, 4 Drawing Sheets

(51) Int. Cl.
| | |
|---|---|
| *B01J 13/00* | (2006.01) |
| *C09K 3/00* | (2006.01) |
| *B01F 3/12* | (2006.01) |
| *B82Y 30/00* | (2011.01) |
| *B82Y 40/00* | (2011.01) |
| *H01L 31/0224* | (2006.01) |
| *H01L 31/0296* | (2006.01) |
| *H01L 31/032* | (2006.01) |
| *H01L 31/0368* | (2006.01) |
| *H01L 31/18* | (2006.01) |

(52) U.S. Cl.
CPC ....... *B01J 13/0026* (2013.01); *B01J 13/0039* (2013.01); *B82Y 30/00* (2013.01); *B82Y 40/00* (2013.01); *H01L 31/0296* (2013.01); *H01L 31/022425* (2013.01); *H01L 31/0326* (2013.01); *H01L 31/0368* (2013.01); *H01L 31/18* (2013.01); *H01L 31/1828* (2013.01)

(58) Field of Classification Search
USPC ..................................... 516/9, 77, 78, 96, 97
See application file for complete search history.

(56) References Cited

U.S. PATENT DOCUMENTS

2012/0220066 A1* 8/2012 Cao ................... H01L 21/02568
   438/73
2013/0037110 A1* 2/2013 Mitzi ................ H01L 21/02568
   136/264

FOREIGN PATENT DOCUMENTS

| WO | 2010124212 A2 | 10/2010 | |
|---|---|---|---|
| WO | 2011066205 A1 | 6/2011 | |
| WO | WO 2011066205 A1 * | 6/2011 | ............. B82Y 30/00 |

* cited by examiner

LARGE-GRAIN CRYSTALLIZED METAL CHALCOGENIDE FILM, COLLOIDAL SOLUTION OF AMORPHOUS PARTICLES, AND PREPARATION METHODS

This application is a 371 of PCT/EP2013/051597, filed on Jul. 4, 2013, which claims priority to French Application No. 1257242, filed Jul. 26, 2012.

The present invention relates to a method for making a film or continuous thin layer of crystallized metal chalcogenide with large grains deposited on a substrate.

More particularly, the present invention relates to a solid photovoltaic device comprising a film or a so-called metal chalcogenide layer as an absorption layer.

Still more particularly, a metal chalcogenide layer according to the invention will be used as an absorption layer on a solid photovoltaic device, notably of the substrate type or of the superstrate type comprising at least:

one optically transparent conductive layer, a so-called front contact layer, for example of the TCO (transparent conductive oxide) type, and one insulating and transparent compound layer, for example a layer of ZnO or $ZnMg_xO_{1-x}$, and one buffer layer of a type n semi-conductor, for example CdS or $In_2S_3$ or Zn(S,O,OH), and one so-called absorption layer of type p, and one layer of conductive material, a so-called rear contact layer, for example a metal layer of molybdenum (Mo), gold (Au), graphite (C), Nickel (Ni) or further aluminium (Al), silver (Ag) or indium (In).

In a solid photovoltaic device said to be of the substrate type, the layers above are completed with:

a metal grid applied against said front contact layer, thus forming the front face (sunny side) of the device, and a glass or steel layer applied against said rear contact layer.

In a solid photovoltaic device said to be of the superstrate type, the layers above are completed with a glass layer forming the front face (sunny side) of the device, applied against said front contact layer.

Solid photovoltaic devices with a structure of the substrate type or of the superstrate type are well known to one skilled in the art. For example they are described in the preface of the book<<Thin film solar cells; manufacture, characterization and applications>>, edited by Jef Poortmans and Vladimir Arkhipov, Wiley 2007, ISBN 13 9780470 09126-5, (preface on page xxiv).

The present invention also relates to a method for preparing a colloidal aqueous solution of amorphous nanoparticles of a metal chalcogenide according to the invention, to the obtained colloidal solution and to its use for making a film of metal chalcogenides with large grains.

In the present description, by <<colloidal solution>> or <<colloid>>, is meant a liquid of a homogenous dispersion of particles for which the dimensions range from 2 to 500 nm, it being understood that below 2 nm, a liquid solution and not a so-called <<colloidal solution>> is obtained. The stability of such a homogenous dispersion is due to the slow separation of the two solid and respective liquid phases.

By <<material consisting of amorphous nanoparticles>>, is meant a material containing no or very few crystallized particles, i.e. characterized by the absence of a diffraction peak, by diffraction of X-rays (XRD technique).

Still more particularly, the present invention relates to metal chalcogenides of formula M-C wherein:

M represents one or several identical or different metal elements selected from Cu, Zn, Sn, Ge, Sb and Bi, preferably Cu, Zn, Sn and Sb, and C represents one or several identical or different chalcogenide elements selected from S, Se and Te.

The highest photovoltaic conversion rates based on metal chalcogenides are greater than 20%; they are obtained today with photovoltaic cells comprising as an absorption layer, a layer of the type $CuIn_{1-x}Ga_xSe_2$.

However, indium (In) and gallium (Ga) are not very abundant on Earth and are therefore expensive for mass production. Cadmium telluride CdTe is another well known example from among metal chalcogenides which gives the possibility of obtaining photovoltaic devices with high yield (>17%). But, the relatively low abundance of cadmium and tellurium, as well as the toxicity of Cd are a problem.

The metal chalcogenide compounds M-C as defined above are of particular interest for manufacturing an absorption layer of an inexpensive photovoltaic device with relatively high yield, since the metals M listed above are abundant and non-toxic.

The present invention more particularly relates to absorption layers of the $Cu_2ZnSnS_4$ (CZTS) type as well as to their derivatives $Cu_2Zn(Sn_{1-y}Ge_y)(S_{1-x}Se_x)_4$ (noted as CZTGSSe), SnS, $Sb_2S_3$ and $Cu_2Zn(Sn_{1-y}Sb_y)(S_{1-x}Se_x)_4$ and/or $CuSb(S,Se)_2$.

The metal chalcogenide layers for photovoltaic cells are traditionally obtained with vacuum deposition methods such as co-evaporation (CIGSe), sublimation in a closed space (CdTe) or further sputtering (CZTSSe). However, the production and maintenance costs associated with vacuum techniques are typically high, which limits their use in applications for mass markets. Also, chemical vapor deposition methods resort to vacuum techniques, which make them complicated and costly for continuously achieving deposition and on wide surfaces.

In order to circumvent these limitations, deposition methods at ambient pressure are therefore preferable, such as for example deposition in a chemical bath, electrochemical deposition, spraying, printing or tape casting. Deposition in a chemical bath is generally characterized by low deposition rates relatively to the desirable thickness for the active layer (of the order of one micrometer), by compromises between low chemical yield and thickness uniformities (a fortiori on large surfaces) and the formation of material with low crystalline quality (which requires subsequent annealing) with inclusion of more or less controlled impurities which makes the technique unsuitable for manufacturing the photovoltaic active layer. Likewise, electrochemical deposition does not either allow continuous deposition and poses problems for controlling uniformity over large surfaces, which imposes relatively slow deposition rates.

It is therefore preferable to achieve deposition of the active photovoltaic layer with a deposition method based on a solution, for example deposited by spraying or by printing, or on a slurry, for example deposited by tape casting. In every case, these deposition techniques at atmospheric pressure, potentially continuous techniques and on large surfaces are based on a more or less concentrated colloidal or liquid solution.

As compared with a liquid solution, the colloidal solution has certain advantages. In a liquid solution, the useful species (copper, tin, sulfur, etc.) are dissolved in the solvent, for example in ionic form (example $Cu^+$) or as ionic complexes (example $Cu(CH_3CN)_4^+$, $Cu(NH_3)n]^{2+}$, $Sn(OH)_6]^{2-}$ etc.). In a colloidal solution, also-called a <<colloid>>, solid particles are present in a suspension and consisting of useful chemical species; the size of these particles is less than 1 mm and typically of the order of a few tens of nanometers.

By comparison with the liquid solution, a first benefit of the colloidal solution is to be able to separate the useful solid portion i.e. the particles, from the liquid portion (by filtration or sedimentation/centrifugation) and thus be able to rinse the colloid from its impurities and from possible secondary products, residues of chemical reactions which may have been used for making the colloid. A second benefit is that the useful chemical species are already gathered in a solid way at an atomic scale with stoichiometry/chemical composition equal to or close to the desired final composition, which ensures better control of the final composition, relatively to a liquid solution which may easily be poorly mixed. A third benefit of the colloidal solution is that it may be used as a starting solution for forming a dense layer with different methods, the nanoparticles may be dried and sintered so as to produce a more or less porous material (for then being used for diverse applications, such as electrodes for batteries, for catalysis, etc.) or else re-dispersed in a dispersion liquid allowing deposition by spraying or by tape casting on a substrate. Further, it is also possible to deposit the particles on an inside of a nano-porous substrate in order to modify the surface properties thereof. For example this is the case of nano-porous films of nanocrystalline $TiO_2$ (n semi-conductor) of a photovoltaic device, for example by soaking a nano-porous $TiO_2$ substrate in a so-called colloidal solution of a metal chalcogenide.

The best photovoltaic performances of cells based on CZTSSe films are obtained when the film is made by a method via a hybrid route between a liquid and a colloid (Todorov & al.: Thin solid Films Vol. 519, N° 21 (2011) pp 7378-81). However, the hydrazine solvent used by this team is both very highly toxic and very flammable in air, which requires precautions of use incompatible with industrial use. In order to reduce the risk of flammability, the hydrazine was also diluted down to 50% by adding water, which had the consequence of slightly reducing the performance from 9.6% to 8.2%. In spite of this, the toxicity and precautions of use related to hydrazine persist.

Another relatively well documented method in the literature is the method said to be <<by hot injection of precursors>> (WO2008/021604A2). This method consists of conducting a chemical reaction, for several hours and at a high temperature (between 220° C. and 300° C.) between metal precursors (salts in the form of powders) dissolved in an oleylamine solvent or other solvents, also toxic or dangerous for humans and/or the environment, of the alkylamine or alkyl phosphine (TOPO) type, and of hot injecting a solution containing the chalcogen. For example metal sulfur, selenium or a salt based on sulfur is typically dissolved in TriOctylPhOsphine (TOPO) oxides. TriOctylPhOsphine oxide is extremely destructive for tissues of mucosas, of the upper respiratory tract, of the eyes and of the skin. In an alternative method, (Chinese patent CN102108540), of hot injection (180-280° C. for 2-60 min), the octadecylamine organic solvent used for dissolving the sulfur powder is a flammable, explosive and extremely dangerous solvent for the eyes, the skin and aquatic media. This is why more particularly the invention relates to a method for preparing a metal chalcogenide colloidal solution.

It is generally recognized by one skilled in the art that low photovoltaic performances are obtained when the active absorbing layer of the photovoltaic device, based on inorganic crystalline semi-conductors such as silicon, semiconductors III-V (AsGa, AlGaAs etc.) or metal chalcogenides CdTe, CIGS or CZTS, consists of small grains, and that better photovoltaic cells are made from continuous layers with large grains. Typically, the desired grain sizes are of the order of the thickness of the layer, itself of the order of one micrometer.

On the other hand, it may be noted that in the large majority, the colloidal synthesis methods are directed to making crystallized particles. The arguments put forward are generally greater purity, or else the obtaining of a less porous layer, or else further better control of the elementary composition of the particles at an atomic scale (before even forming the layer) and therefore of that of the final layer. Finally, the final crystalline layer which is targeted, would be obtained more easily from crystalline particles, since they already incorporate the desired crystalline phase. However, these methods for making a colloidal solution of crystallized metal chalcogenide particles require addition of ligands, the crystal growth then being thermally activated at 200° C. or more, which represents long and costly methods. Further, the films made from these colloidal solutions of crystalline metal chalcogenide nanoparticles nevertheless have then to be generally subject to additional heat treatment at higher temperatures, of the order of 400 to 600° C., this in order to densify, agglomerate and increase the size of the crystals, preferably up to a grain size close to the total thickness of the film, typically of the order of one micrometer. It would be advantageous, at least economically (lesser thermal budget), to conduct the colloidal synthesis of the particles without having to heat during the synthesis at 200° C.

The first colloidal synthesis studies, in the presence of water have rapidly shown problems of hydrolysis and/or oxidation of the metal ion species notably of the cations $Cu^+$, $Zn^{2+}$, $Sn^{4+}$, $Sb^{3+}$, $In^{3+}$.

A technique known to one skilled in the art for efficiently reducing the problems of hydrolysis and of oxidation in an aqueous medium consists of protecting an ionic species in solution with a ligand.

In WO2011/066205 and WO2011/146791, a method for synthesis of a colloidal solution of crystalline copper chalcogenide nanoparticles is described, wherein metal and chalcogen precursor solutions are applied with ligands, in an acid medium for adjusting the pH and avoiding hydrolysis and/or oxidation of the metal ion species. By <<ligand>>, is meant here a coordination species consisting of an ion or a molecule bearing chemical functions allowing it to bind to one or several metal central atoms or ions through a covalent bond. In WO2011/066205, copper chalcogenide nanoparticles are produced from a reaction mixture of precursor solutions with stirring for several hours and optionally with heating to 100° C. and beyond. In WO2011/146791, the application of water and of a colloidal aqueous solution is avoided in order to avoid problems of hydrolysis and/or oxidation of the metal ion species, notably of the cations $Cu^+$, $Zn^{2+}$, $Sn^{4+}$, $Sb^{3+}$. In both of these patents WO2011/146791 and WO2011/066205, the role of the ligands is also to avoid agglomeration of the formed nanoparticles, an agglomeration which leads to precipitation and therefore to instability of the colloid. It was shown that the application of organic ligands is detrimental to the electric transport properties between the particles.

In WO2011/0662205, the ligands are organic molecules comprising amine, thiol or organic acid groups. These organic ligands aim at complexing said metal in order to slow down the kinetics of the reaction between the metal precursors and the chalcogenide precursor with view to obtaining a colloidal solution of crystallized nanoparticles as shown in FIG. 3 (and not a colloidal solution of amorphous nanoparticles according to the present invention). The colloidal solutions obtained are not very stable and, the presence of ligands in said colloidal solutions obtained makes the method less easy (heating required), longer and more costly, and furthermore in the crystallized chalcogenide film obtained after deposition and annealing of the colloidal solution on a substrate, the carbon or oxide residues from the decomposition of the ligands is a drawback since they may prevent crystallization and/or limit the formation of large grains and/or generate impurities generating electric faults, which is detrimental to the photovoltaic properties of the film.

In WO 2011/0662205, acetonitrile is not mentioned as a ligand and does not correspond to the given definition of a ligand, but is mentioned as a formulation solvent of the colloidal solution after its preparation.

In publications Schulz et al. 1997/2000 (Photovoltaics Program Review edited by AIP Press, New York 1997, WO99/37832) and Zhang et al. 2012 (Applied Physics Express 5, 2012, 012301), methods are described for preparing a colloidal solution of metal chalcogenides consisting of amorphous or slightly crystallized nanoparticles for producing a semi-conducting absorbing film of a photovoltaic device. In both of these publications, the colloidal metal chalcogenide solution is made from a mixture of a first precursor solution of said metal M and of a second precursor solution of said chalcogen. In Schulz et al. above, a colloidal solution of a metal chalcogenide $CuInGaSe_2$ (CIGS) is more particularly prepared and in Zhang et al. above, a metal chalcogenide $Cu_2ZnSn(S,Se)_4$ (CZTSSe) is prepared from a precursor solution in organic solvents, pyridine and methanol. More particularly, in this method, the question is to typically dissolve metal precursor salts i.e. iodides such as $CuI$, $CdI_2$, $ZnI_2$, $SnI_4$, $InI_3$, $GaI_3$, in pyridine, and on the other hand dissolve a chalcogenide precursor salt (of sodium or potassium, such as $Na_2Te$, $Na_2Se$, or $Na_2S$) in methanol. Both of these solutions are then mixed at −78° C. or −42° C. or further −0° C. according to the published cases (and not by hot injection as this is the customary case in methods for colloidal synthesis of crystallized nanoparticles), by introducing the sulfur/methanol solution into the metal/pyridine solution, and then the mixture is brought back to room temperature for several minutes during which the unstable colloid naturally precipitates.

The initial colloidal solutions (before forming a thin layer) were therefore colloidal non-aqueous solutions of non-crystallized (amorphous) or slightly crystallized nanoparticles.

Under the conditions applied in these publications, it is proposed that water causes destabilization, aggregation and decomposition of the colloid by ion exchange of the methanol or acetonitrile by water which adheres to the surface of the particles, which would then introduce oxygen into the deposited layers and would degrade their photovoltaic performance.

In references Schulz et al. 1997/2000 and Zhang et al. 2012 above, the synthesis of a colloidal solution of amorphous nanoparticles by mixing a solution of precursors is achieved under cold conditions (−178° C., −42° C. or 0° C.) which represents a restriction and a cost and forces the use of organic solvents compatible with these temperatures, but relatively toxic, notably methanol and/or pyridine.

These temperature conditions seem to be imposed by the requirement of stabilizing the relevant metal chalcogenide colloid in the relevant solvent. Further, in references Schulz et al. 1997/2000 and Zhang et al. 2012 above, the thin layer films deposited on a substrate obtained by deposition from these colloidal solutions consisting of amorphous or slightly crystallized particles are characterized by small grain sizes, even after annealing at a high temperature, with which it is not possible to obtain high quality photovoltaic performances. In particular in WO99/37832 (Schulz et al.), the CIGS layer with small grains obtained after deposition by spraying has too large porosity and was not able to be densified in spite of various heat treatments. Indeed, in spite of many annealing attempts, the CIGS films obtained always included an intermediate layer consisting of small grains, which does not correspond to the criteria of a high quality layer for a photovoltaic application. Indeed, the low photovoltaic performance of the CIGS cell was ascribed to the high series resistance of this intermediate, porous and small-grain layer.

A disadvantage of the method described in Schulz et al 1997/2000 above from amorphous nanoparticles stemming from a methanol/pyridine mixture, is therefore such that it does not give the possibility of producing a dense CIGS layer with large grains, which are required for making a high yield photovoltaic device.

In Zhang et al. 2012 above, the film obtained by deposition of the colloidal solution of metal chalcogenide nanoparticles comprised nanoparticles of relatively large sizes (80 nm) and after annealing on a substrate did not exhibit any large grains. On the other hand, in Zhang et al. 2012, the authors did not succeed in obtaining a colloidal solution when the metal chalcogenide only comprised sulfur and not a combination of sulfur S and of selenium Se. In Zhang et al. 2012 above, the solution of methanol comprising both $Na_2S$ and $Na_2Se$, led to the formation of a strongly aggregated and amorphous solid colloid, in which the authors distinguish rounded particles with a size of 80 nm of CZTSSe ($Cu_2ZnSn(S,Se)_4$). After deposition on molybdenum and then densification annealing, a negligible photovoltaic result (0.0002%) was obtained when the annealing at 550° C. was carried out only under nitrogen, because of crystalline decomposition of the film (according to XRD analysis). A photovoltaic result of 2.2% is obtained when the 550° C. annealing is carried out under nitrogen with addition of tin, which would avoid decomposition. Except for an X diffraction spectrum proving the presence of CZTSSe crystals after the heat treatment step at a high temperature (550° C.), no indication on the size of the film grains is given.

A first object of the present invention is therefore to provide a novel method for preparing a colloidal solution of metal chalcogenide nanoparticles which is fast and economical to carry out, notably a method which allows preparation of a colloidal solution at room temperature not requiring heating for hours at 100° C. and beyond and not requiring cooling down to 0° C. or below.

Another object of the present invention is therefore to provide a method allowing preparation of metal chalcogenide colloidal solutions of formula M-C as defined above, not involving the application of toxic solvents or requiring cold reaction temperatures, in particular a temperature of less than or equal to 0° C.

Another object of the present invention is to provide a method for making a film obtained from a colloidal solution with which it is possible to obtain metal chalcogenide crystals with large grains, said film being deposited on a substrate, useful for imparting high photovoltaic performances to a photovoltaic device comprising them.

More particularly, an object of the present invention is therefore to provide a method for preparing a colloidal solution of metal chalcogenide of formula M-C as defined above which is carried out at room temperature and at an atmospheric pressure not involving the application of a dangerous and/or toxic solvent or the application of a ligand with a covalent bond as defined above and/or without adding acid in precursor solutions upon preparing the colloidal solutions.

Finally, an object of the present invention is to provide a stable colloidal solution of amorphous nanoparticles of a metal chalcogenide which allows it to be deposited at atmospheric pressure and at room temperature and then densified by annealing on a substrate in order to obtain a crystallized metal chalcogenide film in the form of large grains with a low roughness surface condition.

According to the present invention, it was discovered that for preparing a colloidal solution of metal chalcogenide of formula M-C as defined above, it is possible to operate in an aqueous medium without decomposition of the colloid in return for conditions for application of the method for preparing a colloidal aqueous or hydro-alcoholic solution defined hereafter and allowing application of a method for making a film of crystallized semi-conducting metal chalcogenide nanoparticles with large grains as also defined hereafter.

To do this, the present invention provides a method for quasi-instantaneous preparation, and at room temperature, of a colloidal aqueous, alcoholic or hydro-alcoholic solution of amorphous nanoparticles of metal chalcogenides of formula M-C wherein:

M represents one or several first metals, either identical or different, selected from Cu, Zn, Sn, Ge, Sb and Bi, preferably Cu, Zn, Sn and Sb and C represents one or several chalcogenide elements either identical or different selected from S, Se and Te, characterised in that the following successive steps are carried out at a temperature from 0° to 50° C., preferably from 20° to 40° C. wherein:

a) a first solution of precursor(s) of said first metal(s) M, other than one or more chalcogenide salts C in solution, is prepared, in a solvent consisting of pure acetonitrile or mixed with water and/or an alcohol other than methanol, preferably ethanol, and b) a second aqueous, alcoholic or hydro-alcoholic solution of precursor(s) of chalcogenide(s) C consisting of one or more chalcogenide salts of second metal(s), other than one or more first metal(s) M, is prepared, the alcohol of said second solution being other than methanol, preferably ethanol, and c) both of said first and second solutions of precursors are mixed at atmospheric pressure and at room temperature until a crude colloidal solution is obtained quasi-instantaneously, comprising primary amorphous nanoparticles with sizes of less than 30 nm, preferably 3 to 20 nm, and d) the solid portion is separated from said colloidal solution of step c), preferably by centrifugation in order to obtain a solid residue after removing the liquid supernatant, and e) the solid residue obtained in step d) is rinsed by pouring on it an aqueous, alcoholic or hydro-alcoholic solution in order to form a colloidal solution, the alcohol of said aqueous, alcoholic or hydro-alcoholic colloidal solution being other than methanol, preferably ethanol, and f) again the solid portion is separated from said colloidal solution of step e), preferably by centrifugation in order to obtain after removing the liquid supernatant, a rinsed solid residue as a humid paste, and g) said humid paste from step f) is re-dispersed in a dispersion solvent comprising, preferably consisting, an aqueous, alcoholic or hydro-alcoholic solution, the alcohol of said alcoholic or hydro-alcoholic solution being, if necessary, a non-toxic alcohol, notably an alcohol other than methanol.

According to the present invention, in the method for preparing the colloidal solution, the preliminary preparation is achieved at room temperature or requiring reduced heating of two separate solutions of precursors based on salts of M and respectively a salt of C with different solvents, without adding any ligand, notably steps a) and b), and their mixture at a reduced temperature notably at room temperature and under atmospheric pressure as defined in steps a) to c).

The smallest size of the nanoparticles obtained in step c) makes the rinsing steps d) to g) more effective for removing the by-products of the reaction as well as the synthesis solvent acetonitrile and other residual impurities.

By <<ligand>>, is meant here an organic molecule (other than the molecule C) capable of binding and/or complexing a said first metal M, notably an organic molecule substituted with at least one group selected from the amine (—NH$_2$), thiol (—SH), amide or thioamide groups, notably —CONH$_2$ or —CSNH$_2$, and/or organic acid groups (such as the carboxylic acid group —COOH) or a phosphoric acid group, notably —PO$_3$H$_2$.

A colloidal solution stable at room temperature obtained without adding any ligand is not only easier to obtain and to apply, but further, it comprises less residual impurities, which contributes to improving the quality of a film obtained after deposition and annealing of the colloidal solution as described hereafter. In particular, this contributes to obtaining a crystallized continuous film with large grains and more homogenous with better photovoltaic performances.

Preferably, in step g) a dispersion solvent is applied, consisting in an aqueous, alcoholic or hydro-alcoholic solution, the alcohol of said alcoholic or hydro-alcoholic solution being a non-toxic alcohol having a boiling temperature of less than the boiling temperature of water, preferably ethanol or propanol, still preferably consisting in a water/ethanol mixture.

These dispersion solvents were selected for their property of dispersion of amorphous nanoparticles (concentration, stability of the colloid, viscosity, non-toxicity), giving the possibility of forming a liquid, homogenous and stable colloid with amorphous nanoparticles of small sizes, which do not naturally precipitate at room temperature before at least 24 hours, and may be deposited by spraying (viscosity, vapor pressure and evaporation temperature) under optimum conditions in order to obtain a continuous, homogenous film without any impurities as described hereafter.

An alcohol having a boiling point below that of water is advantageous because in a method for making a film obtained by deposition, by spraying and annealing of the colloidal solution on a substrate as described hereafter, during the contact of the colloidal solution on the hot plate of the substrate, evaporation of the solvents occurs and it appears to be preferable that the alcohol evaporates before the water in order to set aside the risks of residual carbon contamination stemming from said alcohol within said film.

Ethanol and propanol are preferred because of their total miscibility in water, in addition to their boiling temperature below that of water (and a vapour pressure greater than that of water).

The room temperature used for the preparation of the solutions as well as during the mixing of steps a) to c) is defined as a temperature comprised between 0° C. and 50° C., preferably from 20 to 40° C.

This method for preparing a colloidal solution according to the invention is therefore particularly advantageous in that:
- it is carried out at a reduced temperature notably at room temperature and at atmospheric pressure,
- it is quasi-instantaneous and provides a homogenous and stable colloid, and
- it allows application of an aqueous solvent in the absence of any toxic solvent and/or organic ligand with a covalent bond and without adding any acid, and
- the pH is self-controlled at an acid pH below 2, without adjusting any pH, because of the applied solvents and precursors, and
- acetonitrile is not a dangerous or toxic solvent and allows protection of the atoms of the metal cations against oxidation thereby playing the role of a protective ligand against hydrolysis of the precursors and/or of the formed particles, without being engaged into a covalent bond unlike a ligand.

The rapidity of the reaction in step c), typically carried out in a time interval of less than one minute, even less than 5 seconds, is the consequence of the absence of any complexing ligand and binding said metal.

This reaction rapidity of the precursors in step c), contributes to obtaining amorphous nanoparticles and of smaller sizes, the nanoparticles not having the time for growing at the expense of the others.

On the other hand, the high concentrations and small sizes of nanoparticles impart greater stability to the colloid of nanoparticles obtained in step c), the latter remaining stable for at least two days at room temperature.

The colloidal solution obtained further gives the possibility of obtaining a film of crystalline metal chalcogenide(s) with large grains according to the object of the present invention after deposition and annealing of a layer of amorphous metal chalcogenide nanoparticles on a substrate.

Another advantage of the use during the colloidal synthesis, of an aqueous, alcoholic or hydro-alcoholic solvent according to the invention is that they allow easier dissolution of the chalcogenide precursor salts, i.e. in stronger concentrations, notably a concentration of more than 5 M (moles per liter) in the case of the NaSH or $Na_2S$ salts. The obtained colloids may thus be further concentrated. In the same way, the reaction by-products are more easily dissolved and removed by means of a lesser number of rinsing steps with aqueous or hydro-alcoholic rinsing solvents.

According to other preferred more particular features:
- in step a), said salt of said first metal M is a halide, preferably a chloride, and
- in step b), said chalcogenide of second metal (other than M) is an alkaline or earth-alkaline salt, preferably a sodium or potassium salt, preferably $Na_2S$ or NaSH.

In prior publications, the metal halide salt or metal precursor M was often in the form of an iodide, the iodide being better dissolved than the chloride in the applied organic solvents. The application of chloride precursors according to the present invention, notably in an aqueous or hydro-alcoholic medium is, however, advantageous since chloride salts are more easy to access (and less expensive) and the colloid CZTS which results from them is more stable than with iodide precursors.

Still preferably, M is a ternary mixture of Cu, Zn and Sn, and C is S, and preferably in step c) amorphous nanoparticles of $Cu_2ZnSnS_4$ are obtained.

The application of a metal chalcogenide only containing the chalcogen S without any selenium (Se) is advantageous since selenium reduces the band gap of the absorption layer and once it is applied in a photovoltaic device, the metal chalcogenide with only S gives the possibility of obtaining greater photovoltaic voltages (beyond 0.6 Volts according to the literature).

In another embodiment M-C is selected from $Sb_2S_3$ and SnS.

In other further embodiments M-C is selected from $CuSbS_2$, $Cu_2Sn(S,Se)_3$, $Cu_2Zn(Sn,Sb)S_4$, $Cu_3BiS_3$ and $Cu_4SnS_4$.

According to other advantageous particular features:
- in step a) said first solution is carried out containing $CuCl_2$, $ZnCl_2$ and $SnCl_4$, and
- in step b), said second aqueous solution of NaSH is carried out preferably at a concentration of more than 5 M, and
- in step c), amorphous nanoparticles of $Cu_2ZnSnS_4$ are obtained notably with a size from 3 to 20 nm.

Another advantageous effect of the application of a hydrosulfide salt of a chalcogenide such as NaSH or KSH is that their reaction with metal chlorides reinforces the acidity of the thereby obtained colloidal solutions, which reduces the risks of degradation of the nanoparticles by possible hydrolysis by the $OH^-$ ions. The pH adjustment, by an additional step for example consisting of adding an acid, is thus unnecessary and the method is easier and therefore advantageous.

According to other particular features:
- in step b), said second aqueous solution of precursor(s) of chalcogenide(s) consist in a solution only containing water as a solvent; and
- in step a), the solvent of said first solution of precursor(s) of metal(s) M consists in acetonitrile mixed with water, preferably in an acetonitrile/water ratio of at least 50/50, preferably pure acetonitrile; and
- steps f) and g) for rinsing the colloid are repeated once or several times by centrifugation and then re-dispersion in an aqueous, alcoholic or hydro-alcoholic solvent; and
- the water and the solvents used are deoxygenated beforehand by sparging/bubbling with a gas not containing any oxygen, preferably a neutral gas, still preferably nitrogen, and the mixture of step c) is made in a vacuum chamber or containing an atmosphere without any oxygen, preferably with a neutral gas, still preferably nitrogen. This latter feature gives the possibility of avoiding oxidation and/or hydrolysis of the metal cations in the precursor solutions and in the colloidal solution.

In the present application, by <<atmosphere without oxygen>>, is meant an oxygen content of less than 1 ppm (parts per million).

The present invention also provides a colloidal solution, or an ink formulated in a so-called dispersion solvent comprising an aqueous, alcoholic or hydro-alcoholic solution, obtained by the method for preparing a colloidal solution according to the invention, of amorphous nanoparticles comprising primary nanoparticles with sizes of less than 30 nm, preferably from 3 to 20 nm, the alcohol of said solution being a non-toxic alcohol notably other than methanol.

More particularly, said colloidal solution consists in said nanoparticles in dispersion in a dispersion solvent consisting in an aqueous, alcoholic or hydro-alcoholic solution of amorphous nanoparticles, said alcohol of said solution having a boiling temperature below that of water, said dispersion solvent preferably consisting in a water/ethanol mixture.

Still more particularly, said colloidal solution does not contain any organic ligands as defined above. By <<primary nanoparticles>> are meant here nanoparticles as obtained before their possible subsequent aggregation in the form of an aggregate of larger size of several primary nanoparticles together.

Obtaining primary nanoparticles of smaller sizes dispersed in aqueous and/or alcoholic solvents of the present invention is advantageous for obtaining not only in a first phase a stable colloid without adding any ligand but also in a second phase, a homogeneous film with large crystallized grains without any residual impurities of organic ligands in the manufacturing method described hereafter.

The present invention provides a method for manufacturing a polycrystalline film of metal chalcogenides with large crystalline grains with sizes at least equal to half the thickness of said film, by means of a colloidal solution according to the present invention, said film being deposited on one or more materials in layers forming a substrate, said metal chalcogenide being of formula M-C wherein:

M represents one or several metal elements, either identical or different, selected from Cu, Zn, Sn, Ge, Sb and Bi, preferably Cu, Zn, Sn and Sb, and C represents one or several chalcogenide elements either identical or different selected from S, Se and Te, wherein the following successive steps are carried out:

1) a layer of amorphous nanoparticles of metal chalcogenide(s) is deposited on said substrate from a said aqueous, alcoholic or hydro-alcoholic colloidal solution according to the invention, and 2) heat treatment of said layer of metal chalcogenide(s) is carried out at a temperature of at least 300° C., preferably at least 450° C., in order to obtain densification of said layer of metal chalcogenide(s) and crystallization of the nanoparticles, over a thickness from 0.2 to 5 μm, preferably of about 1 μm.

In examples 3 and 4 hereafter, it is shown that the preferential dispersion solvent is a water-ethanol mixture for producing after deposition by spraying and heat treatment, a continuous and dense (without any crack or hole) film of crystalline CZTS layers with a large grain, and adherent on a molybdenum substrate.

More particularly, in the method for manufacturing a film according to the invention:

in step 1), a said aqueous colloidal solution is sprayed with a carrier gas consisting of a gas without any oxygen preferably a neutral gas, still preferably nitrogen, at atmospheric pressure and at a substrate temperature brought to at least 100° C., in order to form on a so-called substrate, a layer of said colloidal solution with a thickness from 0.5 to 15 μm preferably of about 3 μm, and, steps 1) and 2) are carried out in a vacuum chamber or filled with a gas without any oxygen, preferably a neutral gas, still preferably nitrogen.

Advantageously, said substrate is a substrate intended to be covered with a type p semi-conductor absorption layer in a solid photovoltaic device.

More particularly, said substrate consists of a glass or steel layer covered with a so-called rear contact layer, preferably consisting of a molybdenum layer, useful in a solid photovoltaic device of the substrate type.

Still more particularly, said substrate is a substrate intended to be covered with an absorption layer in a photovoltaic device of the superstrate type, said substrate consisting of a glass layer covered at least successively with:

a transparent front contact conductive layer, and preferably a transparent and insulating compound layer, and a buffer layer of a type n semi-conductor.

Said buffer layer of a type n semi-conductor is then a p-n junction with said absorption layer of type p, said buffer layer for example consisting of CdS, $In_2S_3$, or Zn(S,O,OH).

The present invention also provides a film of crystallized metal chalcogenide(s) with large crystalline grains with a size at least equal to the half of the thickness of said film, continuously deposited on a substrate obtained by the method for making a film according to the invention.

More particularly, the film has surface roughness with an arithmetic mean height of the peaks Sa, according to the ISO 25178 standard, of less than half of the thickness e of the film, preferably less than 0.2×e, preferably still less than 0.15×e for a surface area of at least 20×20 $\mu m^2$.

This low surface roughness property of the film obtained by the method according to the invention, is original and advantageous in that it avoids direct contact between both adjacent layers of the film. This continuity property of the layer is advantageous for avoiding electric short-circuits of the photovoltaic device.

Still more particularly, the film consists of metal chalcogenide(s) $Cu_2ZnSnS_4$ (CZTS) in the Kesterite crystalline form, with a thickness from 0.1 to 5 μm, preferably about 1μm.

In order to determine whether a thin layer of a dried colloidal solution is crystallized or amorphous, the X-ray diffraction technique is therefore applied, (see for example the text book of Rene Guinebretière, $2^{nd}$ edition Lavoisier, Paris, ISBN 2-7462-1238-2).

The size of a particle is measured by electron microscopy, either by scanning electron microscopy (SEM), or by transmission electron microscopy (TEM).

The X-ray diffraction technique (for example in the θ-2θ mode) also allows measurement of the size of the crystallite, from the integrated width of the diffraction peaks. For this, the material must have diffraction lines (be crystalline) but also the crystallites have to be sufficiently small, of the order of 50 nm or less than 100 nm. Beyond, the technique is unsuitable because of the physical limits of the XRD equipment.

In order to determine the size of an amorphous/slightly crystallized nanoparticle at a scale of a few tens of nanometers, transmission electron microscopy (TEM) is therefore preferred (for example see the text book Transmission Electron Microscopy, Volumes I, II, III and IV according to Williams and Carter, Springer editions 1996, ISBN 978-0-306-45324-3).

The morphology of a crystalline film is characterized by the dimensions of its reliefs in particular the size of its grains and its roughness, which are observed by microscopy (optical microscopy, atomic force microscopy, SEM or TEM electron microscopy, etc.)

In the case of crystallized films with large grains, the technique of choice for measuring grain sizes of the order of one micrometer is then the scanning electron microscope (SEM) (see for example the text book <<Microscopie Electronique à Balayage et Microanalyses>> (Scanning Electron Microscopy and Microanalyses), Ed. Brisset, EDP Science 2008, ISBN 978-7598-0082-7).

The measurement of the surface roughness of a film was conducted with an atomic force microscope (AFM) and a local scanning probe microscope (SPM), of model AFM/SPM from Agilent Tech. (U.S.A.), series 5100.

The present invention also provides a photovoltaic device comprising an absorption layer consisting of a said film deposited on a substrate according to the invention.

More particularly, the photovoltaic device according to the invention comprises the following successively stacked layers:
- a substrate, preferably of sodium-lime glass, covered with a thin conductive molybdenum layer used as a rear electric contact layer,
- a said thin absorbing material layer, preferably essentially consisting of CZTS,
- a buffer layer, preferably a layer made on the basis of a type n semi-conductor, such as cadmium sulfide CdS, or indium sulfide $In_2S_3$, or further oxysulfide alloys such as Zn(S,O,OH),
- a conductive transparent layer, preferably a layer consisting of a first so-called intrinsic (non-doped) ZnO layer, covered with a transparent conductive layer, preferably of tin-doped indium oxide (ITO) or aluminium-doped zinc oxide (AZO), and
- a metal grid (of aluminium, nickel, and/or silver) of the electric contact face before being deposited on said transparent layer.

Other features and advantages of the present invention will become apparent in the light of the detailed exemplary embodiments which will follow with reference to the following figures.

Figure 2A:
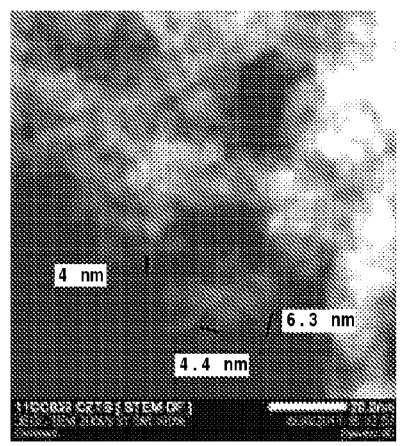
FIGS. 2A, 2B and 2C represent photographs of CZTS nanoparticles in colloidal form taken with an SEM type microscope (FIG. 2A), and after deposition as a film deposited by spraying on a substrate (FIG. 2B), and after annealing at 525° C. of said film (FIG. 2C).
Figure 2B:
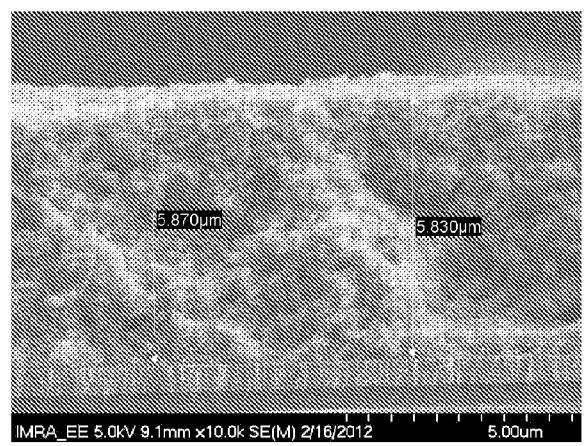
Figure 2C:
Figure 2C:

These photographs are taken by electron microscopy, measured at different steps of the manufacturing of the film, on a glass substrate covered with molybdenum (FIG. 2B and 2C).

Figure 3:
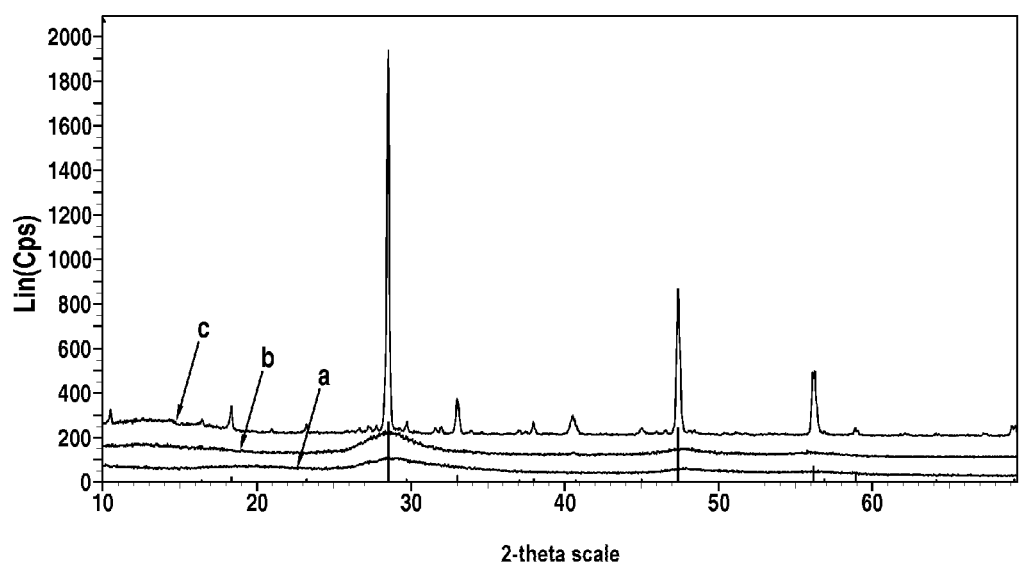

FIG. 3 is an X-ray diffraction spectrum measured on layers of nanoparticles of FIGS. 2A (curve a), 2B (curve b) and 2C (curve c). The Cps (<<Counts per second>>) values in ordinates are according to a linear scale (<<Lin>>).

Figure 4A:
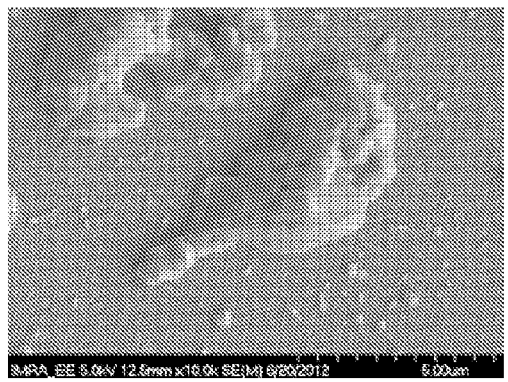
Figure 4B:
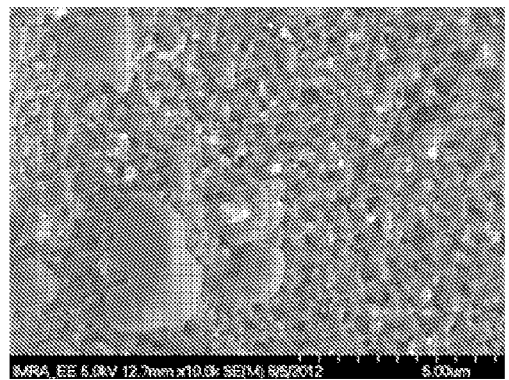
Figure 4C:
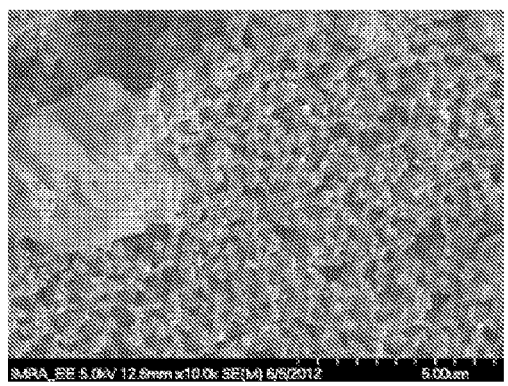
Figure 4D:
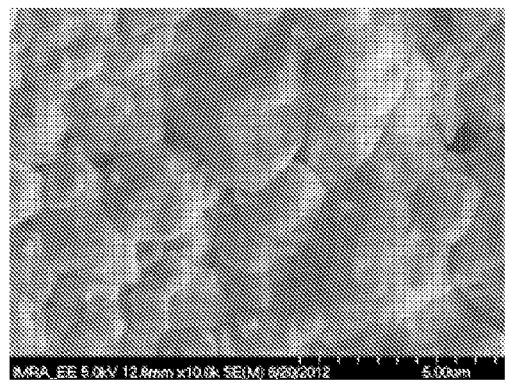

FIGS. 4A) to 4D) represent photographs taken by electron microscopy, after crystallization annealing at 525° C., of the surface of a CZTS film according to Example 4 dispersed in a pure ethanol solvent and deposited by spraying at 75° C. (FIG. 4A), a TEP solvent and spraying at 300° C. (FIG. 4B), a DMSO solvent and spraying at 300° C. (FIG. 4C) and a water solvent and spraying at 300° C. (FIG. 4D).

Figure 5:
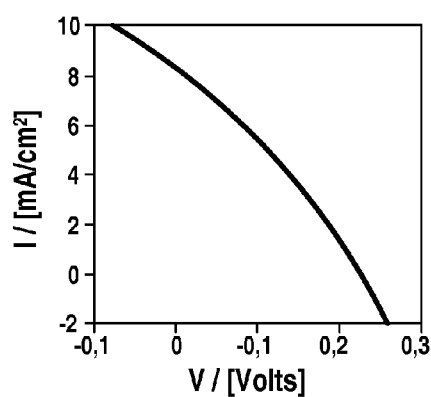

FIG. 5 represents a characteristic current-voltage curve under a solar simulator (100 mW/cm$^2$) of a photovoltaic cell $Cu_2ZnSnS_4$ in a Mo substrate structure according to Example 7 (active surface area=0.25 cm$^2$).

EXAMPLE 1

Preparation of a CZTS Colloid

A colloid of nanoparticles Cu—Zn—Sn—S was made by reacting a mixture of metal salts, CuCl, $ZnCl_2$, $SnCl_4.5H_2O$ in water/acetonitrile with an aqueous solution of NaSH, at room temperature and under an inert nitrogen atmosphere, according to the global reaction:

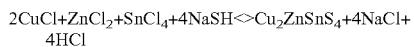

$2CuCl+ZnCl_2+SnCl_4+4NaSH \Leftrightarrow Cu_2ZnSnS_4+4NaCl+4HCl$

This reactive system is suitable in the sense that the byproducts of the reaction, for example NaCl or HCl are soluble in water while the nanoparticles are solid and dispersed as a colloid.

The aqueous solution (0.12 M) of NaSH is prepared in a 50 ml bottle, by weighing 0.56 grams of hydrated NaSH powder (provider Aldrich, product 16,152,7) and adding 50 ml of deionized water, deoxygenated beforehand by bubbling for 30 minutes with nitrogen. This aqueous solution of the sulfur precursor NaSH is then sealed with a plug, and then stored.

The solution of copper-zinc-tin (CZT) metal chlorides in water/acetonitrile is prepared in a nitrogen glove box by:
1. weighing 469 mg of copper precursor powder: CuCl (provider Aldrich 224332), 415 mg of zinc precursor powder: $ZnCl_2$ (provider Aldrich 208086) and 893 mg of tin precursor powder: hydrated $SnCl_4$ (Aldrich 244678); and then
2. by adding 10 ml of anhydrous acetonitrile (Aldrich 271004);
3. after dissolution and mixing with ultrasound for a few minutes, a yellow-greenish solution is obtained with a concentration of 1 mol/L (Cu+Zn+Sn) which is then diluted 5 times in acetonitrile (volumes in a ratio from 1 to 4) and then itself diluted twice with water (volumes 1 and 1) and thereby obtaining a concentration of 0.1 mol/L.

The colloidal synthesis reaction is conducted by pouring 10 ml of the NaSH solution (0.12 M) in 10 ml of a solution of metal precursors CZT (0.1 M). This synthesis carried out at ambient pressure and temperature is very rapid and gives rise to a colloidal CZTS solution, according to the global reaction indicated above.

The pH of this crude colloid was measured to be equal to pH=0.3 which defines a very strongly pronounced acidity, favorable for avoiding hydrolysis of the metal elements or particles.

This crude colloid was analysed by Transmission Electron Microscopy. A model 2100 FEG 200kV from JEOL (Japan), equipped with EDX (Energy-dispersive X-ray Spectroscopy) detectors, STEM BF (Scanning Transmission Electron Microscope Bright Field) and STEM DF (Surface Transmission Electron Microscope Dark Field) with a wide angle HAADF (High Angular Annular Dark Field) is used.

For this, a sample holder consisting of a carbon membrane on a nickel grid was soaked in the non-diluted colloid and simply dried in ambient air before being introduced into the TEM vacuum chamber. According to FIG. 1A, the dried colloid forms aggregates of primary nanoparticles, the characteristic size of which is from 2 to 5 nm and with a rounded shape characteristic of amorphous particles. The average elementary analysis achieved by EDX measurement on many areas, indicates that these dried particles contain the majority elements Cu, Zn, Sn, S, and Cl as impurities. With larger TEM magnification (FIG. 1B), i.e. by concentrating the beam of incident electrons, certain crystalline planes seem to be observable, ascribable to probable crystallization under the beam, during the TEM observation. Electron diffraction analysis as illustrated with the example of FIG. 1C, shows the presence of a diffuse diffraction ring, corresponding to atomic diffraction planes characterized by interatomic distances compatible with the known crystalline structure of kesterite $Cu_2ZnSnS_4$ (CZTS). The crude colloid observed under TEM therefore appears to be amorphous or slightly crystallized in the probable kesterite structure (in particular with crystallization during TEM observation with strong magnification).

The analysis of the composition (TEM EDX) is the following:

| Cu | Zn | Sn | S | Ni | Cl | at. % |
|---|---|---|---|---|---|---|
| 24.2 | 15.7 | 10.4 | 47.4 | 0.0 | 2.3 | 100 |

This crude colloid is then poured into a centrifugation tube and then centrifuged for 5 min at 6,000 rpm (Universal centrifuge 16 from Hettich Zentrifugen AG), i.e. an acceleration of 3,700 G expressed relatively to gravity. This allows separation of the solid and liquid portions. The transparent upper liquid portion (the supernatant) is removed by pouring it into a bottle of acid liquid waste. The lower solid portion is then rinsed by adding 20 ml of water. After introducing a magnetic bath covered with Teflon, this solution was placed on a magnetic plate and mixed with magnetic stirring at about 200 rpm for 5 minutes. New centrifugation for 10 min at 9,000 rpm (i.e. 8,400 G) is carried out, followed by removal of the supernatant. This rinsing procedure aims at removing the reaction products such as NaCl, HCl and other excess ionic species. We measured that the lower and humid solid residual portion forms a slurry which consists of about 100 mg of dry material (CZTS) and 500 mg of liquid, by weighing before and after drying in vacuo.

This slurry was then re-dispersed in a water/ethanol mixture (5 ml/5 ml), and then mixed with magnetic stirring for 5 minutes at room temperature; the obtained colloid is then stable for several days and may be used for deposition by spraying/atomization.

Figure 1A:
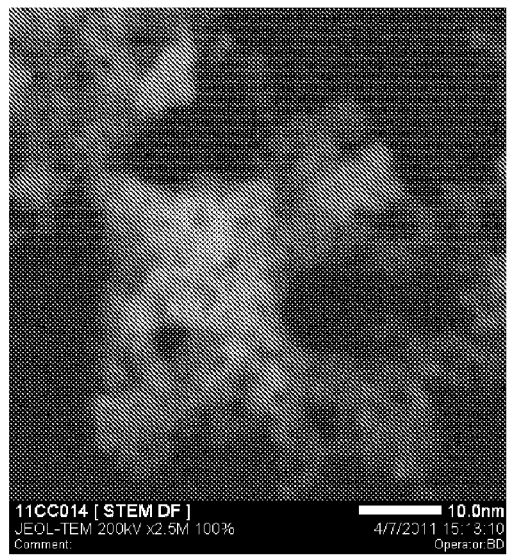
FIGS. 1A and 1B represent TEM observation photographs of a crude CZTS colloid prepared in a water/acetonitrile mixture according to Example 1, by measurement with an STEM detector (FIG. 1A) and at a greater TEM magnification (FIG. 1B), FIG. 1C being a photograph of the diffraction spectrum obtained by electron diffraction ED on the dried powder.
Figure 1B:
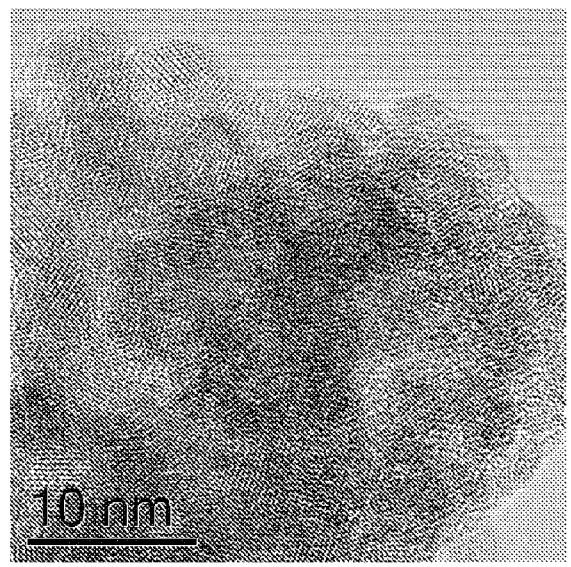
Figure 1C:
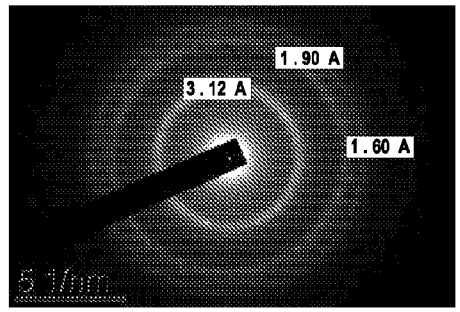

The particles suspended in this rinsed colloid were then analyzed by TEM microscopy (FIG. 2A) by using the same procedure with a carbon membrane on a nickel grid, as described before for the TEM measurements of crude colloid (FIG. 1A). The microscopy with a STEM DF detector of FIG. 2A shows primary nanoparticles of a rounded shape, agglomerated and with a similar size between 2 and 7 nm typically. EDX analysis (not shown) indicates the majority presence of elements Cu, Zn, Sn and S but the absence of the chlorine element, which illustrates the effect of the rinsing. As high resolution TEM analysis and electron diffraction is unreliable because of the crystallization under a beam of electrons, the crystallographic characteristics were measured by X ray diffraction on the slurry from the rinsed crude colloid (but not re-dispersed), coarsely spread out on a glass plate of 2.5×2.5 cm² at room temperature.

The X-ray diffraction measurements were conducted in a diffractometer of the Bruker AXS D8 series 2 type, by using an X-ray source corresponding to the copper emission line $K\alpha$, in a grazing mode (with an angle of incidence set to 1°) and a detector movable over a circular arc in order to obtain a 2θ diffraction angle spectrum scanned from 10° to 70° with a pitch of 0.04.

Curve A of FIG. 3 (lower spectrum) shows the diffraction spectrum of X-rays of the humid slurry of FIG. 2A. This spectrum does not exhibit well-defined diffraction peaks but rather two very wide bumps, for which the positions in 2θ=28.4° and 2θ=47.3° may correspond to those of the two main peaks (112) and (220)/(204) respectively, of the kesterite crystalline structure from X-ray diffraction reference spectra measured on powder crystalline materials. Thus, the particles making up the rinsed colloid and then dried in ambient air, are in majority amorphous or slightly crystallized, in consistency with the TEM observations of FIGS. 1A and 1B (crude colloid) or TEM observations of FIG. 2A (rinsed and reconditioned or re-dispersed colloid).

The solid nanoparticles of the crude colloid and of the rinsed and then re-dispersed colloid are both characterized by a nanometric size (2-7 nm), consisting of the elements Cu, Zn, Sn and S, of an amorphous crystalline or even very slightly crystallized structure.

EXAMPLE 2

Preparation of Crude Colloid of Concentrated CZTS

The concentration of the CZTS colloid noted in moles per liter (or M), is defined as the number of molecules of the compound CZTS ($Cu_2ZnSnS_4$ or equivalent to the number of tin atoms) per unit volume. In Example 1 above, the concentration of the crude colloid is 0.0125 M. In the present example, the concentration of the CZTS colloid was brought to 0.25 M, which is equivalent to about 100 mg/ml. One skilled in the art will recognize there a value corresponding to the typical concentration of a slightly diluted slurry, which may be deposited by tape casting. This illustrates the versatility of the colloidal synthesis method.

In this alternative, an aqueous solution (6 M) of NaSH is prepared, by weighing 2.24 g thereof for 4 ml of solution. A solution of copper-zinc-tin (CZT) metal chlorides in acetonitrile is prepared by weighing 188 mg of CuCl, 166 mg of $ZnCl_2$ and 357 mg of $SnCl_4$ hydrate for 5 ml of solution. The synthesis is achieved by pouring, in a first phase, 11 ml of deionized and deoxygenated water into the solution of metal precursors, and then in a second phase, the 4 ml of NaSH solution.

The thereby made crude colloid of the compound CZTS is concentrated (0.25 M) and, further has strong stability after adding water in the rinsing step indicated in Example 1 above.

EXAMPLE 3

Preparation of a Crystallized CZTS Film on a Glass Substrate Covered with Molybdenum The composition of the crystallized film $Cu_2ZnSnS_4$ and the composition of the amorphous film deposited by spraying before annealing described in the form of Cu—Zn—Sn—S, are conventionally distinguished hereafter.

Amorphous layers of Cu—Zn—Sn—S were deposited from suspended nanoparticles, by spraying on substrates of the Mo/glass type formed with sodium-lime glass with a thickness of 1 mm covered with a 700 nm molybdenum layer.

In the present example of deposition by spraying, a colloid according to Example 1 above was prepared and the colloid was then re-dispersed in a water/ethanol mixture (5 ml/5 ml).

The spraying step was carried out in a glove box (model GP concept type T3 in stainless steel, from Jacomex S.A.S., France) filled with nitrogen and equipped with a purification unit (<1 ppm $O_2$, <10 ppm $H_2O$) and with an airlock being used for introducing/extracting samples. Amorphous Cu—Zn—Sn-S films were deposited on Mo/glass substrates (2.5 cm x 2.5 cm) brought to a temperature of 250° C. by means of a heating plate (model 18×18 cm of standard ceramic, reference 444-0617 from VWR International SAS, France) with modified thermal regulation in a closed loop on a thermocouple of the K type placed under the substrate. An X-Y Cartesian robot was used (of the Yamaha type, FXYx 550×550 with an RCX222 controller, distributed in France by New-Mat France) for sweeping over a surface of more than 16 cm² with the spray nozzle used (a sprayer flask on a test tube in borosilicate glass from Glasskeller Basel AG). For injecting the colloidal solution into the nozzle, application of nitrogen pressure was controlled intermittently: open for 0.3 seconds and then a waiting time of 1.7 seconds; this 2 second cycling being maintained during the spraying duration. Good films were obtained with a nozzle-substrate distance of about 15 cm with an average flow of nitrogen carrier gas of 14 L/min at a cylinder nitrogen pressure of 0.2 bars. Thicknesses of 6±1 µm were obtained by deposition by spraying for two minutes of the colloid of concentration 10 mg/ml (i.e. a volume of about 2 ml).

The morphology of the thereby deposited amorphous layers Cu—Zn—Sn—S was determined by Scanning Electron Microscopy SEM (Hitachi Ltd, model S-4700 equipped with an EDX analyser and data processing by the software package NORAN). FIG. 2B is a sectional view of a Cu—Zn—Sn—S film deposited by spraying at 240° C. On this picture, the glass substrate may be seen, covered with a layer of 700 nm of polycrystalline molybdenum with a column structure, and the film Cu—Zn—Sn—S. It is possible to discern that this film is porous and consists of fine particles agglomerated together and separated by vacuum.

The amorphous/slightly crystallized nature of the films obtained by spray deposition from CZTS colloids, was shown by X-ray diffraction measurement as indicated by the spectrum of FIG. 3 (middle curve b). There again, no diffraction peak is clearly detectable.

The annealing step used for densifying and crystallizing the layer in order to form large crystalline grains was carried out in a nitrogen glass box (reference GT concept, from Jacomex SAS, France). The film deposited by spraying was then laid on a heated plate (model Titane plate with a Detlef control case, Harry Gestigkeit, GmbH) and heated gradually under nitrogen up to an annealing temperature of 525° C. maintained for 1 hour, and then cooled for 1 hour. FIG. 2C shows a sectional view of the film obtained after annealing: above the polycrystalline molybdenum layer, a polycrystalline film with a thickness of 1.8±0.2 µm expresses densification of the film which is accompanied by crystallization with formation of the desired large grains (from 1 to 2 µm) i.e. close to the thickness of the film.

The surface condition of the film above was analyzed and its roughness Sa was measured according to the ISO 25178 standard. The average roughness Sa is defined as the arithmetic mean of the absolute values of the ordinates of the roughness profile. The following values were obtained for a film with a thickness of 1.8 µm: 313 nm for a surface of 50×50 µm², 247 nm for a surface of 20×20 µm².

EXAMPLE 4

Preparation of a Crystallized CZTS Film on a Glass Substrate Covered with Molybdenum from a CZTS Ink Formulated in Pure Dispersion Solvents In the present example, a CZTS colloid was prepared according to Example 1, except that the slurry rinsed with water and then centrifuged was then mixed in dispersion solvents different from the water-ethanol 50-50 mixture of Example 3. Among the latter, four were selected for the present example notably for their low vapor pressures at 20° C. for TEP (Tri-Ethyl-Phosphate) (40 Pa) or DMSO (80 Pa) or else high vapor pressures for water (2,330 Pa) and for ethanol (5,850 Pa). The concentration was adjusted to 10 g/L. After deposition by spraying in a glove box according to the invention, the CZTS/Mo/glass samples obtained were then subject to crystallization heat treatment at 525° C. under nitrogen. The surface images of the obtained samples are shown in FIGS. 4A to 4D.

This CZTS film is formed with crystallized CZTS grains, as indicated by the X diffraction spectra, (not shown). However, in the cases, A) ethanol, B) Tri-Ethyl-Phosphate (TEP) or C) DiMethyl-SulfOxide (DMSO), the adhesion to the substrate is not sufficient, the covering level of the substrate is not complete, and the grain size is not homogeneous. Only the water solvent (FIG. 4—case D) gives the possibility of obtaining both a high covering level of the CZTS film with large crystalline grains and good adhesion on the molybdenum/glass substrate.

The present example shows that water is the preferred pure dispersion solvent. Examples 3 and 4 show that the dispersion solvent is preferentially a water-ethanol mixture, which is an abundant solvent, easy to use and non-toxic and which gives the possibility of making, after deposition by spraying followed by a crystallization heat treatment, continuous and dense (without any cracks or holes) crystalline CZTS layers with large grains, and adherent on the molybdenum substrate.

EXAMPLE 5

Preparation of an $Sb_2S_3$ Colloid

A sulfur precursor solution is first prepared by mixing 18 ml of acetonitrile and 2 ml of water at room temperature, and then by pouring therein 18 mg of NaSH powder (0.321 mmol) which spontaneously dissolves. As the NaSH is not or very little soluble in acetonitrile, dissolution occurs in the aqueous portion of the water/acetonitrile mixture.

An antimony metal precursor solution with a concentration of 10.7 mol/L is then prepared by dissolving 4 mg (0.214 mmol) of $SbCl_3$ powder (Aldrich) in a 20 ml solution of pure acetonitrile. No hydrolysis of the $SbCl_3$ salt is noticed during this dissolution.

By pouring the sulfur precursor solution into the metal solution at room temperature, orange coloration is immediately observed, characteristic of the amorphous solid phase $Sb_2S_3$, resulting from spontaneous formation and within a few seconds, of a stable colloid. This colloid is difficult to centrifuge, which shows the great stability of the colloid, which is related to the small size/mass of the primary suspended nanoparticles. Indeed, an analysis by transmission microscopy (TEM) is then conducted: a copper grid with a carbon membrane is soaked for a few seconds in the colloidal liquid so as to collect a small portion of it, and then it is left to dry in ambient air. Observation under TEM indicates agglomerated small primary particles, the individual size of which is of about 20 nanometers. Elementary analysis TEM+EDX shows a majority composition of $Sb_2S_3$ as well as the presence of chlorinated impurities (of the order of 1 atomic percent). No crystalline phase is identifiable by electron diffraction under a TEM electron beam, which indicates that the solid particles of the colloid consist of amorphous antimony sulfide $Sb_2S_3$. The colloidal synthesis by mixing both antimony/acetonitrile and sulfur/water solutions was then achieved according to the global reaction: $2SbCl_3 + 3 NaSH \Leftrightarrow Sb_2S_3 + 3NaCl + 3HCl$.

By using two sulfur and metal solutions prepared under identical conditions with those of the example above, the mixing order was reversed by pouring the metal solution into the sulfur-containing solution. There also, an orange coloration was immediately observed with spontaneous formation of an amorphous colloid $Sb_2S_3$ with a characteristic orange color.

EXAMPLE 6

Preparation of Colloid SnS

A metal solution of tin 0.05 M is prepared in a glass bottle with a capacity of 50 ml, into which is first poured 348 mg of tin precursor powder ($SnCl_2$, anhydrous, Fluka 96529) and then 36 ml of acetonitrile solvent. Dissolution is facilitated at room temperature by ultrasonication for a few minutes.

As in the examples above, a sulfur-containing 0.2 M aqueous solution is prepared by weighing 1.12 g of NaSH powder, and then by adding 100 ml of deionized and deoxygenated pure water in order to achieve their spontaneous dissolution.

The colloidal synthesis is then achieved by mixing at room temperature both solutions, for example by pouring 9 ml of the sulfur-containing 0.2M solution into 36 ml of 0.05 M metal tin solution. A black colloid is then formed spontaneously according to the global reaction: $SnCl_2$+NaSH<=>SnS+NaCl+HCl. This colloid is stable under ambient conditions for several days. The TEM observation of this colloid thereby made and without any other treatment (without any rinsing, centrifugation, re-dispersion etc.) is shown hereafter. In particular, elementary analysis TEM-EDX indicates that the composition is in majority of tin sulfide, with presence of a chlorinated impurity, which is a residual impurity of the reaction according to the following composition (TEM-EDX):

| Sn | S | Cl | C | N | O | at. % |
|---|---|---|---|---|---|---|
| 45.2 | 52.3 | 2.5 | 0.0 | 0.0 | 0.0 | 100 |

The primary particles formed are relatively small, with a characteristic size of the order of 3 to 5 nm. This colloid may then be used in order to be rinsed and then re-formulated as a slurry or an ink which may be used for deposition of thin layers.

EXAMPLE 7

Photovoltaic Device of the Thin Layer Type Made with a CZTS Layer Annealed in a Nitrogen Atmosphere A thin CZTS layer was prepared on a glass substrate probably molybdenum, annealed under an $N_2$ atmosphere, like in Example 3.

On the crystallized continuous CZTS layer with large grains, a buffer layer of approximately 50 nm of CdS was deposited, by deposition in a chemical bath according to the customary procedure of the state of the art (see for example G. Hodes, Chemical Solution Deposition Of Semiconductor Films, ISBN 08247-0851-2, M. Dekker Inc.), by quenching in a mixture maintained at 60° C. of deionized water, of ammonia ($NH_3$, 4M), cadmium nitrate ($Cd(NO_3)_2$, 4mM) and of thio-urea ($SC(NH_2)_2$, 0.2M). After 10 minutes, the samples were rinsed in deionized water and then dried under nitrogen flow.

On this buffer layer, two optically transparent layers were deposited successively by magnetron sputtering with the use of a commercial apparatus H2 from Intercovamex: A first insulating layer of about 50 nm of ZnO [135 W RF, 0.5 Pa of argon] followed by a conductive transparent layer of about 250 nm of indium oxide doped with 10% by mass of tin (ITO) [70 W RF, 0.25 Pa of argon]. The square resistance of the obtained ITO layer is approximately 30 ohms per unit square.

Next, the substrate was divided into 16 electrically insulated cells, each with square dimensions 0.5 cm x 0.5 cm. In order to collect the current and measure the photovoltaic performance, a front face contact was made with a small spot of 0.5 mm of silver deposited by drying a lacquer loaded with silver, on the conductive ITO layer. The rear contact was also directly taken on the molybdenum, at the edge of the substrate.

The photovoltaic yield (or photovoltaic efficiency) was computed from the current-voltage electric characteristics of the photovoltaic diode measured under light irradiation. The conversion yield is the percentage of the electric power delivered by the device at the maximum power point, relatively to the power of the incident radiation: η=(electric power at the maximum power point)/(power of the incident radiation). This photovoltaic efficiency was measured with an electric test bench and which uses a solar simulator delivering an irradiation of 1000 W/m² corresponding to the AM1.5G standard. The measurement bench was calibrated according to the standard procedure on the basis of the known photocurrent of reference cells, as provided by different recognised official institutes.

As illustrated in FIG. 5, the preliminary yields as described in this example, were of the order of 1%, the short-circuit currents were around 8 mA/cm² and the open circuit voltages around $V_{oc}$=0.25V.

The invention claimed is:

1. A method for preparing a colloidal aqueous, or hydro-alcoholic solution of amorphous nanoparticles of metal chalcogenides of formula M-C wherein:
   M represents first metals consisting of Cu, Zn, and Sn, and
   C represents at least one chalcogenide element selected from S and Se,
   the method comprising the following successive steps being performed at a room temperature from 0° C. to 50° C., wherein:
   a) a first solution of precursors of said first metals M is prepared in a solvent consisting of pure acetonitrile, or a mixture of acetonitrile with water and/or an alcohol other than methanol, and
   b) a second aqueous or hydro-alcoholic solution of precursors of the at least one chalcogenides C consisting of one or two chalcogenide salts of second metals, other than said first metals M, is prepared, the alcohol of said second solution, if any, being an alcohol other than methanol, and
   c) both of said first and second solutions of precursors are mixed at atmospheric pressure and at room temperature until a crude colloidal solution is obtained, including a solid portion comprising primary amorphous nanoparticles containing all of the first metals Cu, Zn, and Sn, with sizes of less than 30 nm, and a liquid supernatant, and
   d) the solid portion is separated from said colloidal solution of step c), in order to obtain a solid residue after removal of the liquid supernatant, and
   e) the solid residue obtained in step d) is rinsed by pouring onto it an aqueous or hydro-alcoholic solution in order to form a subsequent colloidal solution including a solid portion and a liquid supernatant, the alcohol of said hydro-alcoholic colloidal solution being other than methanol, and f) again, the solid portion is separated from said subsequent colloidal solution of step e), in order to obtain, after removal of the liquid supernatant, a rinsed solid residue as a humid paste, and g) said humid paste of step f) is re-dispersed in a dispersion solvent consisting of an aqueous or hydro-alcoholic solution, the alcohol of said hydro-alcoholic solution, if any, being a non-toxic alcohol, so as to obtain a dispersion of nanoparticles of chalcogenides of Cu, Zn, and Sn.

2. The method according to claim 1, wherein, in step a), the solvent is acetonitrile alone, in step b), the solvent is water alone, and in steps e) and g) said solvent consists of a hydro-alcoholic solution, the alcohol of said hydro-alcoholic solution being a non-toxic alcohol having a boiling temperature below the boiling temperature of water.

3. The preparation method according to claim 1, wherein:
in step a), said precursors of said first metals are halides of said first metals M, and
in step b), said one or two chalcogenide salts of said second metals are alkaline, or earth-alkaline metal salts.

4. The preparation method according to claim 1, wherein M is a ternary mixture of Cu, Zn, and Sn, and C is S, and, in step c), amorphous nanoparticles of $Cu_2ZnSnS_4$ are obtained.

5. The preparation method according to claim 3, wherein:
in step a), said first solution contains $CuCl_2$, $ZnCl_2$, and $SnCl_4$, and
in step b), said one or two chalcogenide salts consist of NaSH, and
in step c), amorphous nanoparticles of $Cu_2ZnSnS_4$ are obtained.

6. The method according to claim 1, wherein in step g), said nanoparticles are primary amorphous nanoparticles with sizes of less than 30 nm.

7. The method according to claim 6, wherein said nanoparticles are primary amorphous nanoparticles of sizes of 3 to 20 nm.

8. The method according to claim 6, wherein the dispersion solvent in step g) is a hydro-alcoholic solution, and wherein said alcohol of said solution has a boiling temperature below that of water.

* * * * *